United States Patent [19]

Tsunekawa et al.

[11] E Re. 31,207

[45] Reissued Apr. 12, 1983

[54] LEAK CURRENT SUPPRESSING PRINTED CIRCUIT BOARD

[75] Inventors: Tokuichi Tsunekawa, Yokohama; Tetsuya Taguchi, Tokyo, both of Japan

[73] Assignee: Canon Kabushiki Kaisha, Japan

[21] Appl. No.: 58,198

[22] Filed: Jul. 17, 1979

Related U.S. Patent Documents

Reissue of:

[64] Patent No.: 4,114,036
Issued: Sep. 12, 1978
Appl. No.: 703,962
Filed: Jul. 9, 1976

[30] Foreign Application Priority Data

Jul. 24, 1975 [JP] Japan ..... 50-90533

[51] Int. Cl.[3] ..... H01J 40/14

[52] U.S. Cl. ..... 250/214 R; 354/60 R; 361/424

[58] Field of Search ..... 250/214 R, 214 A, 214 C, 250/214 P, 211 J; 317/101 B, 101 C; 354/60 R; 361/424, 397, 404

[56] References Cited

U.S. PATENT DOCUMENTS

| | | | |
|---|---|---|---|
| 3,770,968 | 11/1973 | Hession et al. | 250/214 A |
| 3,786,264 | 1/1974 | Ferro et al. | 250/214 A |
| 3,852,644 | 12/1974 | Seidler et al. | 361/424 |
| 3,983,023 | 9/1976 | Baker et al. | 361/424 |

*Primary Examiner*—David C. Nelms
*Attorney, Agent, or Firm*—Toren, McGeady & Stanger

[57] ABSTRACT

A leak current suppressing printed circuit board in which the input circuit is so designed that between the input terminals a light sensing photoelectric converting element operating in the current mode is connected. The input is guarded by means of the circuit net, whose potential is same as that at the input terminal of the inverting input circuit or the non-inverting input circuit of the high input impedance operation amplifier.

23 Claims, 8 Drawing Figures

LEAK CURRENT SUPPRESSING PRINTED CIRCUIT BOARD

Matter enclosed in heavy brackets [ ] appears in the original patent but forms no part of this reissue specification; matter printed in italics indicates the additions made by reissue.

BACKGROUND OF THE INVENTION

Generally, in the case of the light measuring circuit of a camera or the like, the input and the output circuit of the associated operation amplifier are composed as printed circuits, by providing or wiring the circuit elements on the insulated base plate. In the case of such a light measuring circuit, a photovoltaic converting element such as a silicon photo cell is connected, as a light sensing photoelectric converting element, between the inverting and the non-inverting input terminal of the high input impedance operation amplifier. Further, a circuit arrangement having a diode connected to it is used as the impedance element for Log. compression.

When in such circuit, the light amount incident on the light sensing element is very low, the photoelectric current produced in the photovoltaic element is very small. Accordingly, the light measurement error due to the influence of the leak current in the input circuit becomes large and therefore it is difficult to enlarge the practical light measurement range.

SUMMARY OF THE INVENTION

A purpose of the present invention is to provide a leak current suppressing printed circuit board for preventing the deterioration of the characteristics due to the leak current in the input circuit of the high input impedance operation amplifier.

Another purpose of the present invention is to provide a leak current suppressing printed circuit board for suppressing the leak current in the printed circuit board composing the input circuit so as to enlarge the operation range of the light measuring circuit on the low brightness end.

The above mentioned and other purposes as well as the novel merits of the present invention will be disclosed and the following detailed explanations are made in accordance with the accompanying drawings.

The accompanying drawings are mainly intended as an exemplary explanation of the present invention and therefore the present invention is not limited thereto.

DETAILED DESCRIPTION OF PREFERRED EMBODIMENTS

In FIGS. 1 to 8; 100 is a high input impedance operation amplifier, 101 is a photoelectric converting element such as a silicon photocell. 102 is a diode with log. compression characteristics, 103 is a resistance for adjusting the off-set voltage of the operation amplifier. 104 is an exposure value display instrument such as a meter. 105 is a resistance for adjusting an exposure value display instrument such as a meter. 106 is the constant voltage source for setting the level of the light measuring circuit, giving a bias to the non-inverted input to the operation amplifier 100. Thus, the constant voltage source 106 is temperature compensated with the negative temperature coefficient versus the change of the ambient temperature. 107 is a resistance for adjusting the constant voltage source for setting the level of the light measuring circuit. 108 is the current source. 109 is the current source switch. 110 and 111 are respectively the equivalent resistances for the leak current. 112 and 112' are respectively the guard lines for guarding the inverted or the non-inverted input terminal of the operation amplifier 100. 113 shows a printed circuit plate composing the light measuring circuit. 114 shows a time integrating condenser. 115 shows a count switch. 116 shows a Schmitt trigger circuit for level detecting 117 shows a shutter controlling magnet, and 118 shows a pentagonal prism in camera and the like.

Figure 2:
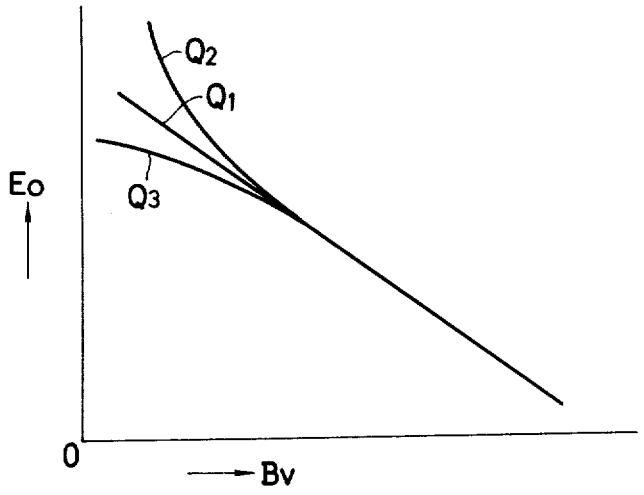
FIG. 2 shows a diagram for showing the deterioration of the characteristics of the light measuring circuit due to the leak current.

In FIG. 2, the abscissa shows as APEX value (Bv) of the brightness of the object to be photographed, while the ordinate shows an output voltage (Eo) of the light measuring circuit.

The curve $Q_1$ in the drawing is that for the ideal characteristics without the leak current, while the curve $Q_2$ shows that for the characteristics in the presence of a leak current from the inverting input (−) of the operation amplifier 100 to the circuit (such as an earth circuit) whose potential is lower than that of the non-inverting input (+). The curve $Q_3$ shows that for the characteristics in presence of a leak current from the inverting input (−) of the operation amplifier 100 to the circuit (such as a positive terminal circuit of the current source) whose potential is higher than that of the non-inverting input (+).

Figure 1:
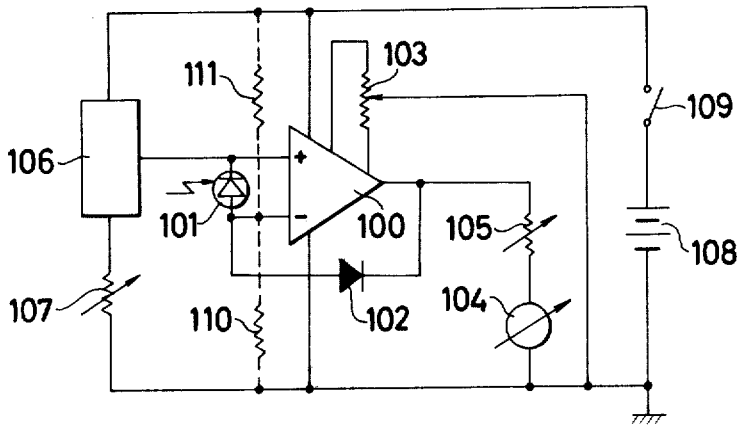
FIG. 1 shows a circuit diagram of a conventional light measuring circuit.

In FIG. 1, in the light measuring circuit of a camera, a communication device, a measuring instrument, a photovoltaic element 101 such as silicon photocell is connected between the inverting input (−) terminal and the non-inverting input (+) terminal of the high input impedance operation amplifier 100 as the light sensing photoelectric converting element.

In the feedback circuit of the high input impedance operation amplifier 100, the diode 102 or the like is inserted as an impedance element for log. compression. The output signal of the operation amplifier 100 is applied to the exposure value display device 104 such as meter through the adjusting resistance 105.

In the case of the printed circuit board for such a light measuring circuit, when the light amount incident on the photoelectric converting element 101 is small small, the photoelectric current produced in the photovoltaic element 101 is very small. Further a leak current takes place between the input circuit of the operation amplifier 100 and the earth or the current source wiring so that the light measurement error due to this influence becomes large. When there takes place a leak current from the non-inverting input circuit of the operation amplifier 100 to the earth circuit, i.e., if the resistance 110 in FIG. 1 assumes a limited value, the photoelectric current (i) produced in the photoelectric converting element 101 in accordance with the brightness of the object to be photographed flows dividedly to the log. compression element 102 and to the leak resistance 110.

In consequence, the current flowing to the log. compression element 102 is represented by (iP−iL), whereby iP is the photoelectric current while iL is the leak current. Thus the output voltage (Eo) of the operation amplifier 100 increases in the range in which the APEX value (Bv) of the brightness of the object to be photographed is low, as is shown by the curve $Q_2$ in FIG. 2.

When, on the other hand, there takes place a leak current from the non-inverting input circuit to the positive terminal circuit of the current source, the resistance 111 in FIG. 1 assumes a limited value, whereby the sum of the photoelectric current (iP) and the leak current (iL') flowing through the leak resistance 111, namely (iP+iL') flows to the log. compression element 102. In consequence the output voltage (Eo) of the operation amplifier 100 decreases in the range in which the APEX value (Bv) of the brightness of the object to be photographed is low as is shown by the curve $Q_3$ in FIG. 2.

Figure 3:
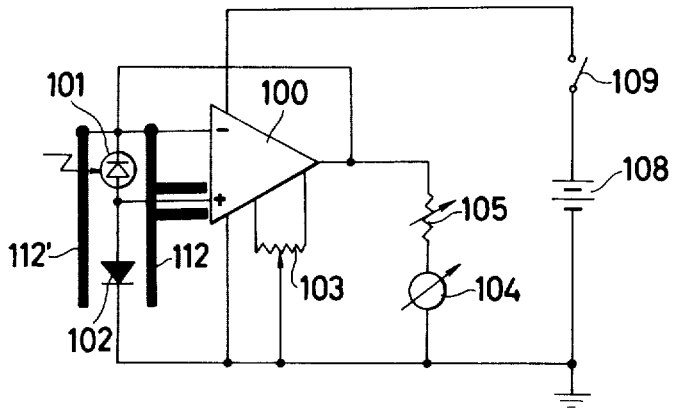
FIG. 3 shows an embodiment of the leak current suppressing circuit in accordance with the present invention.

FIG. 3 shows the leak current suppressing printed circuit board in accordance with the present invention, whereby the guard lines shown by 112 and 112' are provided.

In accordance with the present invention, along the wiring of the signal input circuit for the one input terminal of the operation amplifier 100, the guard lines whose potential is substantially equal to the other input terminal are provided in the neighborhood of the above mentioned signal input circuit.

By means of operating the off-set voltage adjusting resistance 103 of the operation amplifier 100, so as to off set the circuit at zero, the potential difference between the inverting input terminal (−) and the non-inverting input terminal (+) of the operation amplifier 100 is brought to zero, whereby by guarding the non-inverting input circuit with the inverting input potential for level setting, the leak current can be suppressed.

Figure 4:
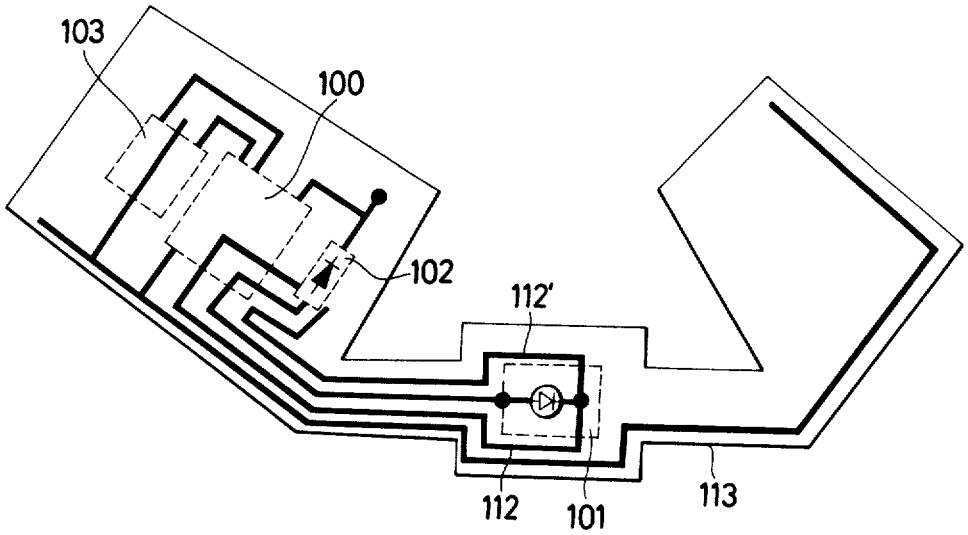
FIGS. 4 to 8 show respectively further embodiments in accordance with the present invention; whereby the members or elements with same figures or numbers are same or similar members in the above drawings.

FIG. 4 shows a plane view of an embodiment in which the leak current suppressing printed circuit board in accordance with the present invention is actually applied as the printed circuit board.

In the drawing, the parts shown in thick lines are the printed circuit provided on the circuit board 113.

In the case of the light measuring circuit, as is shown in FIG. 3, in which the photovoltaic photoelectric converting element 101 is used in the current mode, along the wiring of the signal input circuit for the one input terminal of the operation amplifier 100, the guard lines 112 and 112' whose potential is substantially equal to that of the other input terminal are provided in the neighborhood of the signal input circuit in such a manner that the leak current can be completely suppressed so that the light measuring accuracy especially in the range of the low brightness can be remarkably improved.

Figure 5:
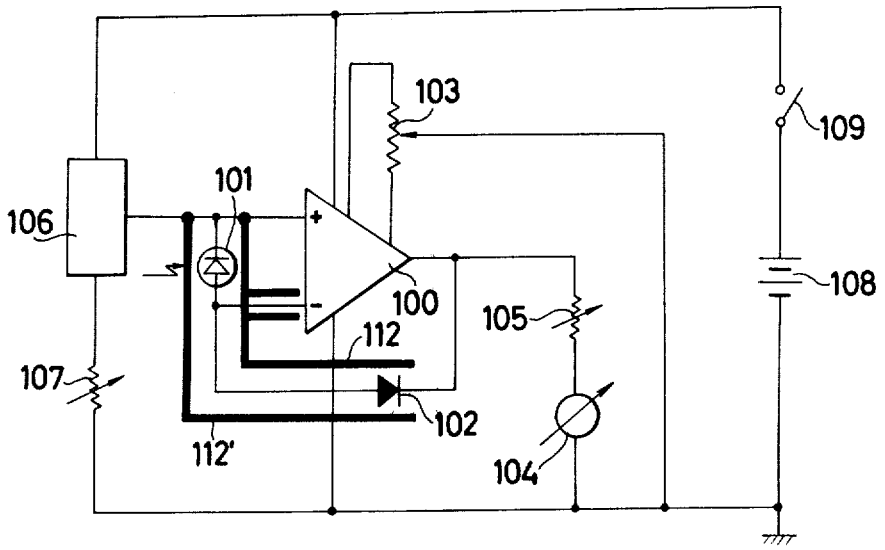
Figure 6:
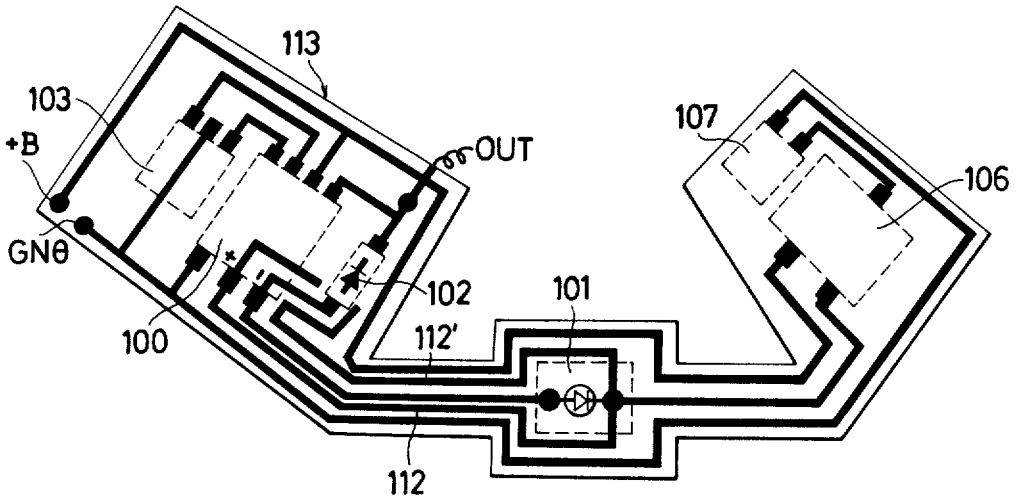

FIGS. 5 and 6 show another embodiment of the leak current suppressing printed circuit board in accordance with the present invention.

In the case of the embodiment shown in FIG. 5, in the light measuring operation amplifier circuit composed of a printed circuit nets on a printed circuit board together with the current supply circuit and the bias circuit connected to the one input terminal of the operation amplifier 100, whereby a photovoltaic photoelectric converting element such as silicon photocell is connected, as a light sensing photoelectric converting element which operates at the current mode, between both input terminals of the high input impedance operation amplifier 100 which includes a diode 102 as impedance element in the feedback circuit, along the wiring of the signal input circuit of the one input terminal of the operation amplifier 100 the guard lines 112 and 112' are provided in the neighborhood of the signal input circuit.

By operating the off-set voltage adjusting resistance 103 of the operation amplifier 100, so as to off-set the circuit at zero, the potential difference between the inverting input terminal (−) and the non-inverting input terminal (+) of the operation amplifier 100 is brought to zero, whereby by guarding the inverting input circuit by the non-inverting input potential for level setting the leak current is suppressed. Namely, even if in the neighborhood of the guard lines 112 and 112' the positive terminal circuit of the current source or the earth circuit or the like is provided, there takes place no leak current from the inverting input circuit of the operation amplifier 100 to those circuits because the guard lines are on the same potential as the inverting input terminal.

FIG. 6 shows the leak current suppressing printed circuit board for the circuit diagram shown in FIG. 5.

Figure 7:
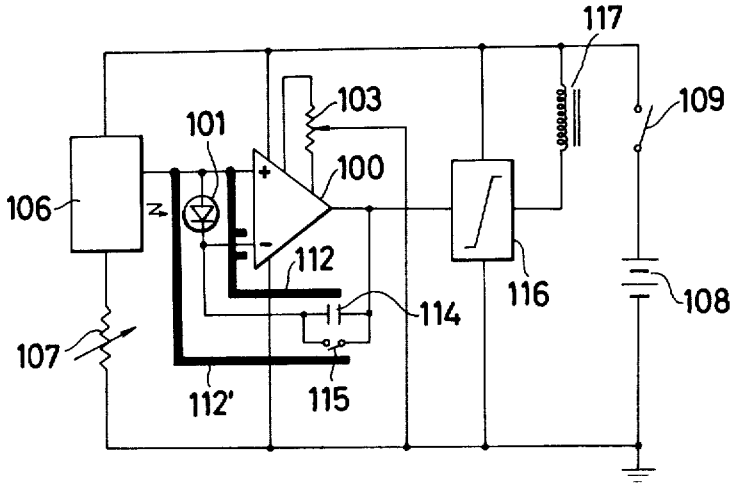

FIG. 7 shows a circuit diagram in which the present invention is applied to the electronic shutter circuit of the external light measuring system.

Nearly at the same time, when in FIG. 7 the shutter of the camera not shown in the drawing is opened the count switch 115 is opened in such a manner that the time integrating condenser 114 is charged with the photoelectric current produced by the photoelectric converting element 101.

When the output of the operation amplifier 100 has reached a certain determined level, the Schmitt trigger circuit 116 is inverted whereby the shutter control magnet 117 is switched off so as to terminate the exposure. In the printed circuit board of this circuit, along the wiring of the signal input circuit of the one input terminal of the operation amplifier 100 the guard lines 112 and 112' whose potential is substantially equal to that of the other input terminal are provided in the neighborhood of the wiring of the signal input circuit so as to suppress the leak current.

Hereby it goes without saying that in the case of the printed circuit boards shown in FIGS. 3–7 in accordance to which the present invention has so far been explained the guard for the inverting input circuit or the non-inverting input circuit of the operation amplifier 100 used not to be the guard lines fixed on the printed circuit board, whereby the three dimensional guard lines provided on the printed circuit boards also meet the purpose of the present invention.

Figure 8:
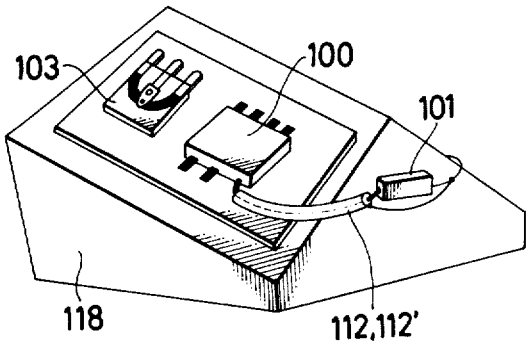

FIG. 8 shows a further embodiment of the leak current suppressing printed circuit boards in accordance with the present invention. In FIG. 8, the leak current suppressing printed circuit board on which the guard lines 112 and 112' are composed in a three dimensional way is provided on the upper surface of the pentagonal prism 118. Hereby the dotted line shows the input circuit wiring of the high input impedance operation amplifier 100, being guarded by the coaxial lines 112 and 112' on the same potential.

What is claimed is:

1. A leak current suppressing light measuring circuit for a camera comprising:

(a) a printed circuit board;

(b) a high impedance operational amplifier having inverting and non-inverting terminals, off-set voltage adjusting means and an output terminal;

(c) a first signal transfer path printed on said printed circuit board for supplying an electrical signal to one of the input terminals of said operational amplifier;

(d) a second signal transfer path printed on said printed circuit board and connected to the other input terminal of said operational amplifier to form a portion of a feedback circuit for the operational amplifier;

(e) a photoelectric converting element connected between said input terminals of the operational amplifier;

(f) a logarithmic suppression element connected between one end of said second signal transfer path and the output terminal of said operational amplifier; and (g) guard lines which are arranged on both sides of the second signal transfer path between the point at which the logarithmic suppression element is connected to the second signal transfer path and a point at which the input terminal of the operational amplifier is connected to the second signal transfer path, one end of each guard line being connected to said first signal transfer path to make these guard lines have virtually the same potential as the first signal transfer path.

2. A light measuring circuit according to claim 1, wherein a signal terminal of said photoelectric converting element is connected to said first and second signal transfer paths.

3. A leak current suppressing light measuring circuit for a camera comprising:

(a) a calculating portion provided with a high impedance operational amplifier having inverting and non-inverting input terminals, off-set voltage adjusting means and an output terminal, one of said input terminals being electrically connected to one end of a first signal transfer path printed on a printed circuit board, and the other end of the first signal transfer path being arranged to receive a power supply signal from a power supply circuit; the other input terminal being electrically connected to one end of a second signal transfer path to form a portion of a feedback circuit of the operational amplifier printed on said printed circuit board, and the other end of the feedback circuit being connected to the output terminal of the operational amplifier through a logarithmic suppression element;

(b) a light receiving part provided with a photoelectric converting element disposed in a position to receive a light coming from an object to be photographed, a signal terminal of said light receiving part being electrically connected between said first and second signal transfer paths; and (c) a leak current suppressing part provided with guard lines printed on said printed circuit board and disposed on both sides of said second signal transfer path in parallel therewith, the guard lines being connected to said first signal transfer path.

4. A leak current suppressing light measuring circuit according to claim 3, wherein said photoelectric converting element is disposed on a printed circuit board which is extended from the printed circuit board of said calculating part and is arranged in a light receiving position of the camera to receive the light of the object to be photographed; one end of the signal terminal of the photoelectric converting element being connected to said second signal transfer path printed on the extended printed circuit board; and the other end of the signal terminal being connected to said guide lines printed on the extended printed circuit board.

5. A leak current suppressing light measuring circuit for a camera comprising:

(a) a printed circuit board provided with printed circuit wiring which is electrically connected to an electrical circuit element and is disposed on a non-functional face of a pentagonal prism;

(b) a high impedance operational amplifier which is disposed on said printed circuit board and is provided with inverting and non-inverting input terminals, off-set voltage adjusting means and an output terminal;

(c) a first signal transfer path which is printed on said printed circuit board and is electrically connected to one of the input terminals of said operational amplifier to permit power supply thereto;

(d) a feedback circuit of said operational amplifier provided with a logarithmic suppression element disposed between the other input terminal and the output terminal of the operational amplifier;

(e) a photoelectric converting element which is electrically connected between the inverting and non-inverting input terminals of said operational amplifier and which is disposed in a light receiving position on the pentagonal prism for receiving a light coming from an object to be photographed; and (f) guard lines provided to three-dimensionally cover a signal path between a connecting point of the input terminal of said operational amplifier and a connecting point of said logarithmic suppression element in said feedback circuit, said guard lines being electrically connected to said first signal transfer path to have the same potential as said first signal transfer path for suppressing a leak current.

*6. A device for preventing leakage current in a light responsive circuit of a camera comprising:*

*(a) a photoelectric element in the light responsive circuit for receiving light from an object; and*

*(b) a guard line surrounding at least a part of said light responsive circuit, said guard line having applied thereto a potential equal to the potential of the light responsive circuit for preventing leakage current in a light responsive circuit.*

*7. A device for preventing leakage current in a light responsive circuit of a camera comprising:*

*(a) a photoelectric element for receiving light from an object;*

*(b) a connecting line for connecting said photoelectric element to an input of said light responsive circuit; and*

*(c) a guard line for surrounding at least a part of said light responsive circuit in co-operation with said connecting line, said guard line having applied thereto a potential equal to the potential of said connecting line.*

*8. A device according to claim 7, in which said guard line is connected to said connecting line.*

*9. A device for preventing leakage current in a light responsive circuit of a camera comprising:*

*(a) a photoelectric element for receiving light from an object; and*

*(b) a connecting line for connecting said photoelectric element to an input part of said light responsive circuit*

*for operating said photoelectric element in a current mode, at least a part of said connecting line being arranged so as to surround at least a part of said input part of said light responsive circuit to prevent leakage current in said light responsive circuit, said connecting line having applied thereto a potential substantially the same as the potential of said input part of the light responsive circuit.*

*10. A device for preventing leakage current in a light responsive circuit of a camera, said circuit including an amplifier, said device comprising:*

*(a) a photoelectric element coupled to said amplifier, said element operating in a current mode; and*

*(b) a guard line which is arranged around an input part of said amplifier, said guard line havng applied thereto a potential equal to the potential of said input part of said amplifier.*

*11. A device for preventing leakage current in a light responsive circuit of a camera comprising:*

*(a) a photoelectric element for receiving light from an object;*

*(b) an operational amplifier having a first and second input terminals, said photoelectric element being connected to said input terminals of said amplifier with first and second connecting lines for operating said photoelectric element in a current mode; and*

*(c) a guard line arranged along the second connecting line, said guard line having applied thereto a potential substantially the same as the potential applied to the first connecting line.*

*12. A device according to claim 11, in which the guard line is connected to the first connecting line.*

*13. A device for preventing leakage current in a light responsive circuit of a camera comprising:*

*(a) a photoelectric element for receiving light from an object;*

*(b) an operational amplifier having first and second input terminals, said photoelectric element being connected to said input terminals of said amplifier in a current mode with first and second connecting lines; and*

*(c) a guard line connected to said first connecting line, said first connecting line and said guard line being arranged so as to surround the second line.*

*14. A device according to claim 6, in which the light responsive circuit and the guard line are arranged on a printed circuit board.*

*15. A device according to claim 7, in which the connecting line and the guard line are arranged on a printed circuit board.*

*16. A device according to claim 10, in which the input part of the amplifier and the guard line are arranged on a printed circuit board.*

*17. A device according to claim 11, in which the connecting line and the guard line are arranged on a printed circuit board.*

*18. A device according to claim 13, in which the connecting line and the guard line are arranged on a printed circuit board.*

*19. A device for preventing leakage current in a light responsive circuit of a camera comprising:*

*(a) a photoelectric element for receiving light from an object;*

*(b) an input circuit including an input line for connecting a photoelectric element to the input part of said light responsive circuit; and*

*(c) a guard line arranged close to the input circuit, said guard line having applied thereto a potential substantially the same as the potential applied to the input part of the light responsive circuit to prevent leakage current in the input circuit.*

*20. A device according to claim 19, in which the guard line is connected to the input line.*

*21. A device according to claim 19, in which the guard line is arranged so as to surround at least a part of the input circuit.*

*22. A device according to claim 20, in which the guard line is arranged so as to surround at least a part of the input circuit.*

*23. A device for preventing leakage current in a light responsive circuit of a camera comprising:*

*(a) a photoelectric element for receiving light from an object; and*

*(b) an input circuit including an input line for connecting a photoelectric element to an input part of said light responsive circuit, said input line having applied thereto a potential substantially the same as the potential applied to the input part of the light responsive circuit, at least a part of said input line being arranged so as to surround at least a part of the input circuit to prevent leakage in the input circuit.*

* * * * *